(12) United States Patent
Ueda (10) Patent No.: US 8,450,842 B2
(45) Date of Patent: May 28, 2013

(54) STRUCTURE AND ELECTRONICS DEVICE USING THE STRUCTURE

(75) Inventor: Yoshiaki Ueda, Shiga (JP)

(73) Assignee: KYOCERA Corporation, Kyoto (JP)

(*) Notice: Subject to any disclaimer, the term of this patent is extended or adjusted under 35 U.S.C. 154(b) by 703 days.

(21) Appl. No.: 12/052,552

(22) Filed: Mar. 20, 2008

(65) Prior Publication Data

US 2008/0230890 A1    Sep. 25, 2008

(30) Foreign Application Priority Data

Mar. 20, 2007  (JP) ................................. 2007-072078
Mar. 20, 2007  (JP) ................................. 2007-072079
Mar. 18, 2008  (JP) ................................. 2008-070263

(51) Int. Cl.
    *H01L 23/04*        (2006.01)
(52) U.S. Cl.
    CPC ...................................... *H01L 23/04* (2013.01)
    USPC ..................... 257/698; 257/675; 257/E33.075
(58) Field of Classification Search
    CPC ....................................................... H01L 23/04
    USPC ............. 257/74, 99, 276, 516, 698, 685, 625,
        257/675, E27.111, E27.114, E27.144, E27.161,
        257/E23.051, E23.101, E23.103, E23.105,
        257/700–796, E33.025, E31.131; 438/122,
        438/123, 124, 126, 127, 7
    See application file for complete search history.

(56) References Cited

U.S. PATENT DOCUMENTS

| 4,922,324 | A  | * | 5/1990 | Sudo ............................. 257/700 |
| 5,111,277 | A  |   | 5/1992 | Medeiros, III et al. |
| 5,521,437 | A  |   | 5/1996 | Oshima et al. |
| 5,959,356 | A  | * | 9/1999 | Oh ................................ 257/738 |
| 5,991,156 | A  | * | 11/1999 | Bond et al. .................... 361/707 |
| 6,919,624 | B2 | * | 7/2005 | Tani et al. ..................... 257/684 |
| 2002/0179289 | A1 | * | 12/2002 | Yamashita et al. ........ 165/104.33 |
| 2003/0021551 | A1 | * | 1/2003 | Carpenter et al. ............... 385/89 |
| 2003/0161109 | A1 | * | 8/2003 | Kurihara et al. .............. 361/709 |
| 2005/0225406 | A1 | * | 10/2005 | Miura et al. ................... 331/176 |

FOREIGN PATENT DOCUMENTS

| JP | 1985-60-041244 | 3/1985 |
| JP | 1993-05-144976 | 6/1993 |
| JP | H07-022576 A | 1/1995 |
| JP | 2004-288948 | 10/2004 |

OTHER PUBLICATIONS

Notice of Rejection issued for counterpart Japanese Application No. 2008-070263.

* cited by examiner

*Primary Examiner* — Cuong Q Nguyen
*Assistant Examiner* — Yosef Gebreyesus
(74) *Attorney, Agent, or Firm* — Procopio, Cory, Hargreaves & Savitch LLP (57) ABSTRACT

A structure includes a circuit substrate including a first substrate and a second substrate. The first substrate has a region where an electronic component is to be mounted. The second substrate has a side surface connected to a first side surface of the first substrate. The structure further includes a frame on the circuit substrate, enclosing the region in a plane view. The frame crosses the boundary between the first substrate and the second substrate.

16 Claims, 9 Drawing Sheets fig1A fig1B fig1C fig1D fig1E fig2A fig2B fig3A fig3B

STRUCTURE AND ELECTRONICS DEVICE USING THE STRUCTURE

CROSS REFERENCES TO RELATED APPLICATIONS

The present application claims priority under 35 U.S.C. §119 to Japanese Patent Application No. 2007-072078, filed on Mar. 20, 2007, to Japanese Patent Application No. 2007-072079, filed on Mar. 20, 2007, and to Japanese Patent Application No. 2008-070263, filed on Mar. 18, 2008. The contents of these applications are incorporated herein by reference in their entirety.

BACKGROUND OF THE INVENTION

1. Field of the Invention

The present invention relates to a structure and an electronics device.

2. Description of the Related Art

A known package for housing an electronics component (hereinafter, a "package"), such as one disclosed in Japanese Unexamined Patent Application Publication No. 5-144976, includes a bottom plate, conductor blocks disposed at the four corners of the bottom plate, and a surrounding wall member.

In the known package disclosed in Japanese Unexamined Patent Application Publication No. 5-144976, the conductor blocks are inserted into corresponding notches provided at the four corners of the bottom plate and bonded thereto. Therefore, stress due to the difference in thermal expansion coefficient between the conductor blocks and the bottom plate tends to act on the four corners of the bottom plate. This tends to produce cracks or the like, which damage the four corners of the bottom plate or penetrate the bottom plate, resulting in degradation of the sealing property of the package.

Heat is mainly dissipated from the bottom side of a metal member on which an electronics component is mounted. Since electronics components emit a large amount of heat, small area of the metal members makes it difficult to allow the electronics components to efficiently dissipate heat outside.

SUMMARY OF THE INVENTION

A structure according to an embodiment of the invention includes a circuit substrate including a first substrate and a second substrate. The first substrate has a region where an electronics component is to be mounted, and the second substrate has a side surface connected directly or indirectly to a side surface of the first substrate. The structure also includes a frame disposed on the circuit substrate, which encloses the region. The frame crosses the boundary between the first substrate and the second substrate.

An electronics device according to another embodiment of the invention includes the structure and an electronics component mounted on the region of the first substrate.

DESCRIPTION OF THE PREFERRED EMBODIMENTS

Hereinafter, exemplary embodiments according to the present invention are described in detail below with reference to the appended figures. It should be understood that the figures are not necessarily drawn to scale and merely show exemplary features of the invention for the purpose of providing an enabling description of various embodiments of the invention. Therefore, the figures along with their associated text do not necessarily limit the scope of the invention as set forth by the claims provided herein.

Figure 2A:
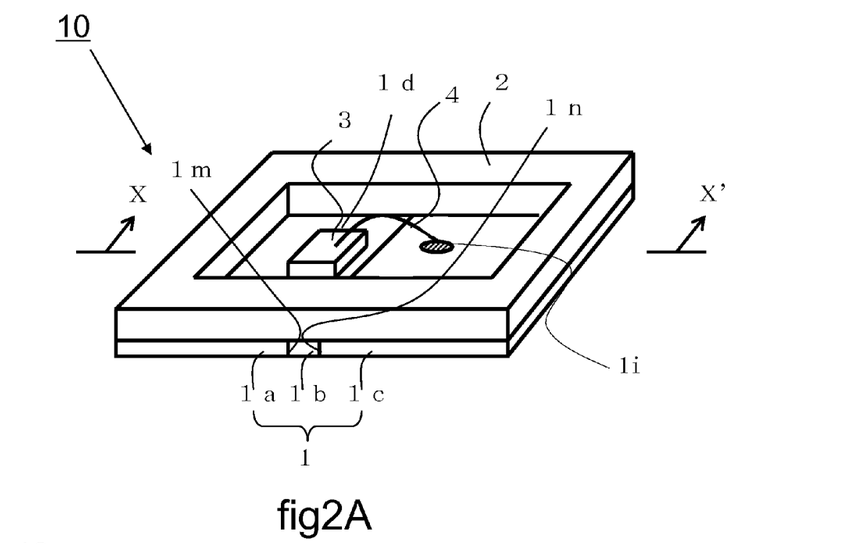
FIG. 2A is a perspective view of a structure.

As shown in FIG. 2a, the electronics device according to one embodiment of the present invention includes a structure 10 including a circuit substrate 1 and a frame 2 disposed on the circuit substrate 1, and an electronics component 3 mounted on the circuit substrate 1.

The circuit substrate 1 includes a first substrate 1a where the electronics component 3 is to be mounted, and a second substrate 1b adjoining the first substrate 1a. The frame 2 encloses the electronics component 3 in a plan view to cross the boundary between the first substrate 1a and the second substrate 1b.

Since the electronics component 3 is mounted on the first substrate 1a, heat from the electronics component 3 is conducted to the first substrate 1a and released from the first substrate 1a to outside. In the case where the first substrate 1a includes a conductive material, the first substrate 1a may also serve as an electrode. Besides, since conductive materials typically have a high thermal conductivity, the first substrate 1a more efficiently absorbs heat from the electronics component 3 and releases the absorbed heat, thereby, reducing the retained heat inside the frame 2, allowing for stable operation of the electronics device.

In the case where the electronics device constitutes a part of an inverter, heat from the electronics component 3 can be efficiently released outside through the first substrate 1a even when a high voltage or a high current is applied to the electronics component 3. Accordingly, an inverter capable of stable operation can be provided.

The electronics device is effective particularly when the electronics component 3 has an electric current flowing therein of not less than 30A. That is, when the electronics component 3 has an electric current flowing therein of not less than 30A and is heated, heat is efficiently dissipated to the outside. Accordingly, stable operation of the electronics component 3 can be realized.

Circuit Substrate

The circuit substrate 1 includes a first substrate 1a and a second substrate 1b. The first substrate 1a has a mounting portion 1d where the electronics component 3 is mounted. The second substrate 1b adjoins the first substrate 1a so that a side surface 1m of the first substrate 1a is directly or indirectly connected to a side surface of the second substrate 1b.

First Substrate

The first substrate 1a includes conductive material, which enables the first substrate 1a to function as an electrode. Therefore, when the electronics component is electrically connected to the first substrate 1a, another electrode is not necessarily formed on the first substrate 1a. As a result, the manufacturing process of the circuit substrate 1 can be simplified. In addition, since conductive materials typically have a high thermal conductivity, the first substrate 1a more effectively absorbs heat from the electronics component 3 and releases the absorbed heat. Accordingly, the retaining of heat inside the frame 2 is reduced to allow for stable operation of the electronics device and to allow the electronics device to be operated for a long time.

As examples of conductive materials for the first substrate 1a, metal materials or composite materials may be used. As examples of the metal materials, copper (Cu), silver (Ag), aluminum (Al), stainless steel (SUS), tungsten (W) or molybdenum (Mo), an iron (Fe)-nickel (Ni)-cobalt (Co) alloy and an iron (Fe)-nickel (Ni) alloy may be used. These metal materials release heat efficiently.

As examples of composite materials, a copper (Cu)-tungsten (W) composite, a copper (Cu)-molybdenum (Mo) composite, a copper (Cu)-diamond composite, an aluminum (Al)-diamond composite, and an aluminum (Al)-silicon carbide (SiC) composite may also be used. In addition to high heat radiation performance, those composites are advantageous in that the thermal expansion coefficients of these composites may be easily adjusted by changing the percentage contents of the materials of the composites. This makes it easier to set the thermal expansion coefficient of the first substrate 1a closer to that of the second substrate 1b, thereby reducing thermal stress acting on the circuit substrate 1 due to the difference in thermal expansion coefficient.

In the case where the first substrate 1a includes a metal material, it may be formed by performing known rolling or metal processing on a metal ingot, for example.

Figure 3A:
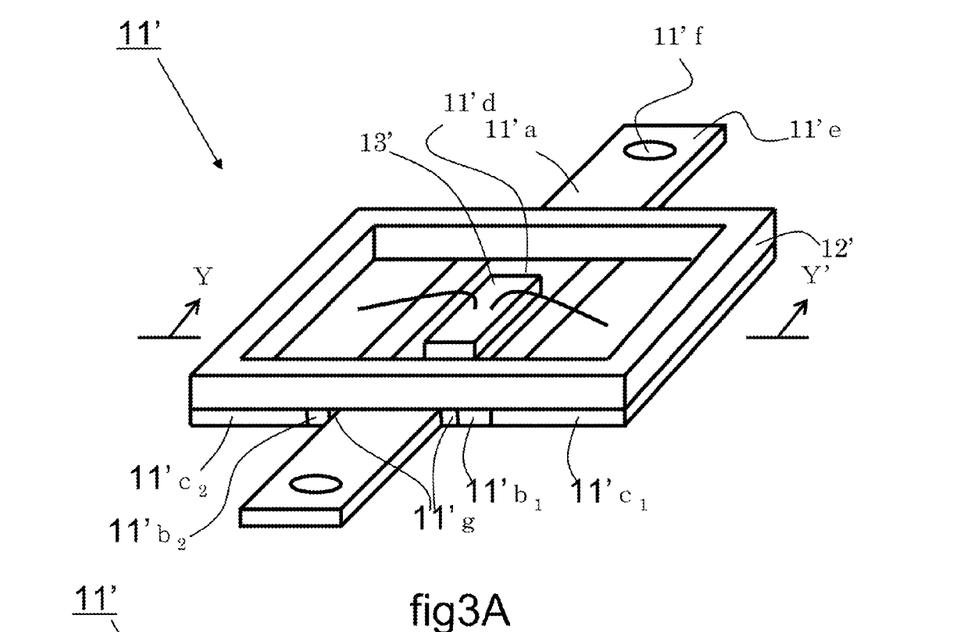
FIG. 3A is a perspective view of one modification example of the structure.

As shown in FIG. 3a, it is preferable that the first substrate 11'a have a projection portion 11'e projecting outwardly from the frame 12'. This allows heat from the electronics component 13' absorbed by the first substrate 11'a to be conducted to outside the frame through the projection portion 11'e, as in FIG. 1b. Thus, the temperature of the mounting portion 11'd of the first substrate 11'a is lower, enabling the electronics component 13' to function properly for a long period. It is preferable that the projection portion 11'e project more outward from an edge of the second substrate 11'b and the first substrate 11'a includes a material having a higher thermal conductivity than a material of the second substrate 11'b. This enables the heat in the mounting portion 11'd of the first substrate 11'a to be conducted to a position further from the electronics component 13 than the second substrate 11'b, thereby the temperature of the mounting portion 11'd can be lowered more.

It is preferable that the projection portion 11'e have a penetrating hole 11'f. This is because a fastener, such as a screw, can be inserted into the penetrating hole 11'f, when the circuit substrate 11' is fixed to an external electric circuit substrate 11' with the fastener. When heat from the electronics component 13' is absorbed by the circuit substrate 11', the projection portion 11'e on which the frame 12' is not formed is easily deformed by the absorbed heat. Thus, the projection portion 11'e can ease the stress due to thermal expansion. If a fastener is inserted into the penetrating hole 11'f, heat can be released to the external electric circuit substrate through the fastener.

Second Substrate

Figure 1A:
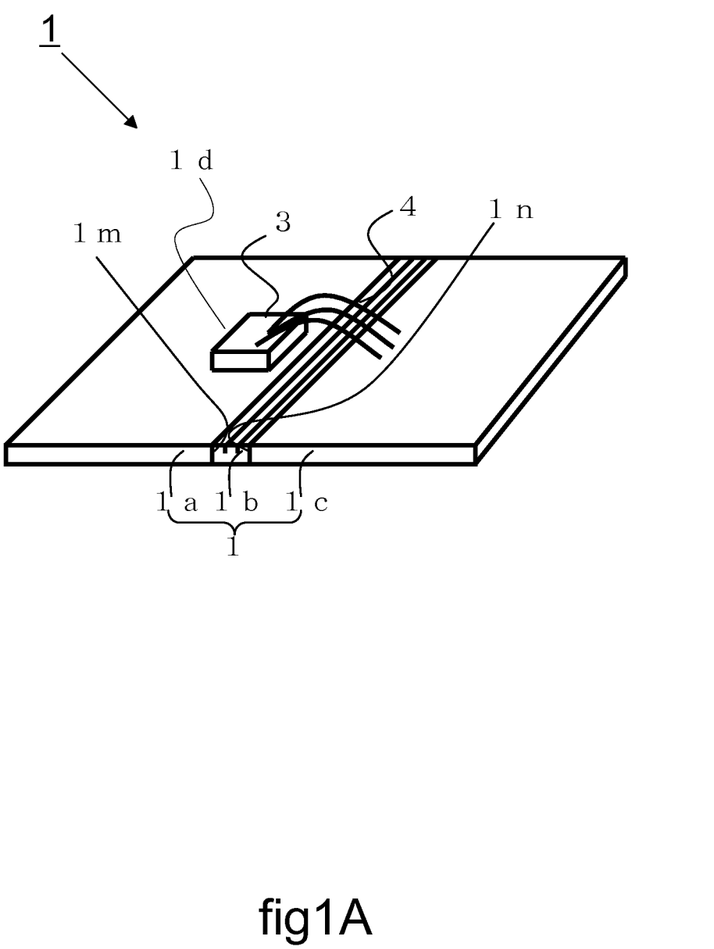
FIG. 1A is a perspective view of a circuit substrate of an electronics device according to one embodiment of the present invention.

As shown in FIG. 1a, the second substrate 1b may include an insulating material such as ceramics, resins, and glasses.

Examples of ceramics for the second substrate 1b include sintered alumina ($Al_2O_3$), sintered aluminum nitride (AlN), sintered mullite ($3Al_2O_3.2SiO_2$) and glass-ceramics.

Examples of resins for the second substrate 1b include epoxy resin, polyphenylene sulfide resin and liquid crystal polymer resin.

Examples of glasses for the second substrate 1b include barium silicate glass, borosilicate glass and aluminosilicate glass.

Generally, ceramics have a higher flexural strength than resins. It is preferable that the second substrate 1b include a ceramic in view of reducing generation of cracks in the second substrate 1b. It is preferable that the second substrate 1b include a material having a thermal expansion coefficient similar to those of the first substrate 1a and an electrode plate 1c since the thermal stress between those substrates 1a, 1b and electrode plate 1c can be reduced. It is preferable that the second substrate 1b includes sintered alumina ($Al_2O_3$) from the viewpoints of its voltage resistance and insulating property since it reduces generation of creeping discharge at the surface thereof when a high voltage is applied between the first substrate 1a and the electrode plate 1c. It is preferable that a ceramic green sheet formed in a predetermined shape be used in the manufacturing process of the second substrate 1b. This enables the dimensional accuracy of the second substrate 1b since the ceramic green sheet has a low rigidity and has a good punching workability.

When the second substrate 1b includes a resin, a molding method for making the second substrate 1b is available, which is preferable from the viewpoint of mass production.

Figure 2B:
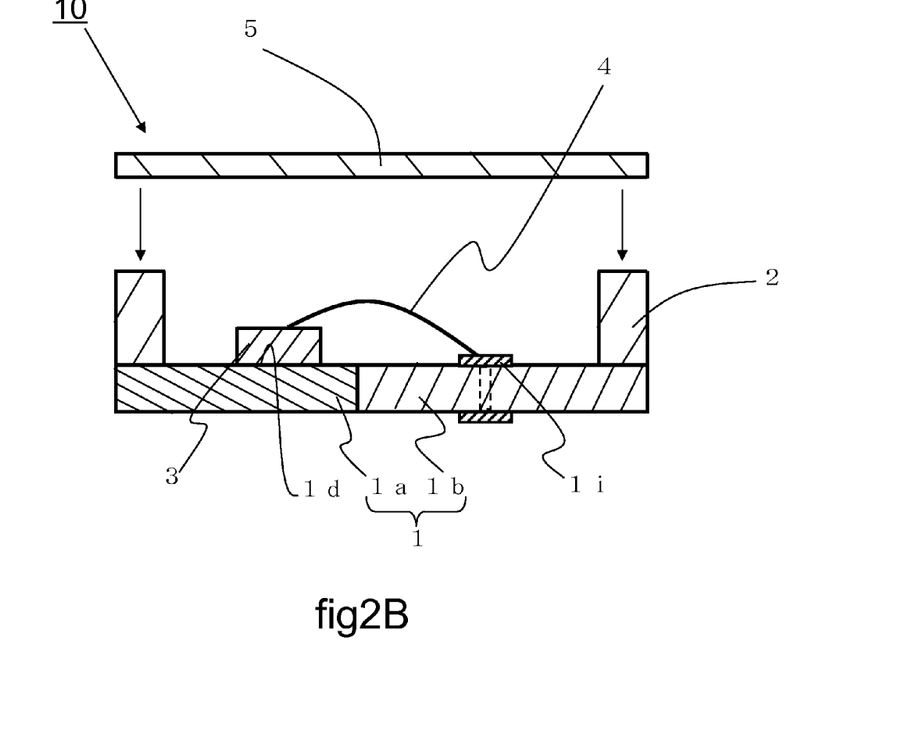
FIG. 2B is a sectional view of the structure shown in FIG. 2A, taken along line X-X'.

As in FIG. 2B, the second substrate 1b may have a through-hole conductor that functions as the electrode 1i. The through-hole conductor can be electrically connected to the electronics component 3 on the first substrate 1a by wire bonding or the like 4.

It is preferable that the through-hole conductor is provided with metal pads 1i on the top and/or bottom surfaces of the through-hole conductor. Each of the metal pads 1i functions as the electrode and has a larger area than the cross-sectional area of the through-hole conductor. This increases the working efficiency in the wire bonding process for making interconnections between the electronics component 3 and the metal pads 1i. If the metal pad 1i is provided on the bottom surface of the second substrate 1b, the working efficiency is increased in electrically connecting an external connection terminal, such as a lead terminal, to the circuit substrate 1.

It is preferable that the electrode including the through-hole conductor and the metal pads 1i include a material such as a copper (Cu)-tungsten (W) composite, a copper (Cu)-molybdenum (Mo) composite, a copper (Cu)-diamond composite, an aluminum (Al)-diamond composite, or an aluminum (Al)-silicon carbide (SiC) composite, since the thermal expansion coefficients of these materials can be easily adjusted by changing the percentage contents of the materials of the composites in accordance with the thermal expansion coefficient of the second substrate 1b.

A plane side surface of the second substrate 1b is directly or indirectly connected to a plane side surface of the first substrate 1a, as described above.

When the second substrate 1b includes a resin, it can be directly connected to the first substrate 1a in the following exemplary way. First, a sheet of resin precursor is prepared. Then, a straight side surface of the sheet and a side surface of the first substrate are brought into contact with each other and connected. Finally, the sheet is cured, whereby the first substrate 1a and the second substrate 1b are connected to each other. Thus, the second substrate 1b adheres to the first substrate 1a. In this case, no adhesive is required between the first substrate 1a and the second substrate 1b, leading to a reduction in the number of components in the circuit substrate 1.

When the second substrate 1b includes a ceramic substrate, it can be connected to the first substrate 1a indirectly in the following exemplary way.

When a side surface of the first substrate 1a and a side surface of the second substrate 1b are indirectly connected to each other, an adhesive is interposed therebetween. This method is useful when the first substrate 1a and the second substrate 1b include a material having a small adhesive force or no adhesive force. This method is advantageous in that the adhesive serves as a stress-cushioning member, thereby improving the strength of the circuit substrate 1. When a brazing material is used as the adhesive, a metal layer is formed on a side surface of one of the first substrate 1a and the second substrate 1b, then, the metal layer and a side surface of the first substrate 1a and the second substrate 1b are connected to each other using the brazing material interposed therebetween. Examples of metals for the metal layer include nickel (Ni), gold (Au), and a silver (Ag)-copper (Cu)-titanium (Ti) alloy.

It is preferable that the bottom surface of the first substrate 1a and the bottom surface of the second substrate 1b be in the same level. This makes the distance between the circuit substrate 1 and the external electric circuit substrate substantially uniform at several regions, when the circuit substrate 1 is mounted on the surface of the external electric circuit substrate. Thus, variation in heat-releasing effect from the circuit substrate 1 to the external electric circuit substrate among the regions can be reduced.

In the circuit substrate 1 shown in FIG. 1A, it is preferable that the top surface of the second substrate 1b be positioned lower than the center of the top surface of the first substrate 1a. This increases the creepage distance between the first substrate 1a and the electrode 1c, and hence, the distance between the first substrate 1a and the electrode 1c, thereby improving electrical insulation of the circuit substrate 1.

Figure 1B:
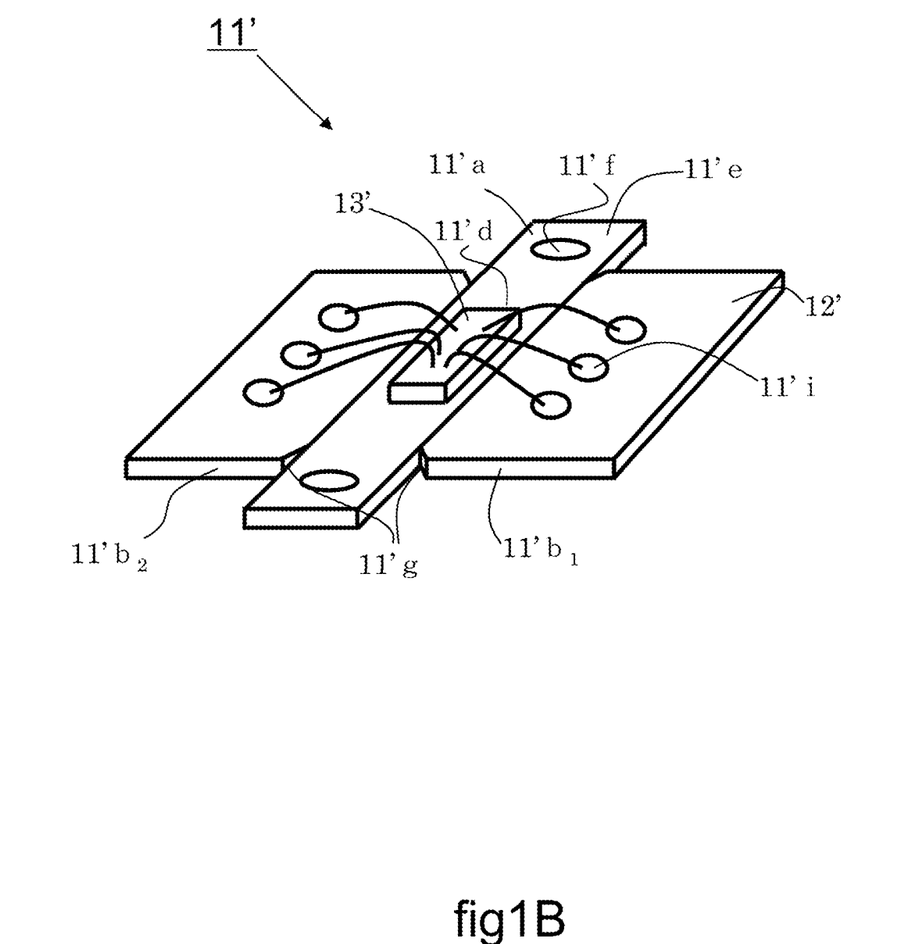
FIG. 1B is a perspective view of one modification example of the circuit substrate.

It is preferable that the second substrate $11'b_1$ and the second substrate $11'b_2$ has chamfers 11'i at the corners of the side surface adjoining the first substrate 11'a, as shown in FIG. 1b. This configuration allows fillets of the brazing material to be easily formed at the chamfers 11'i, when a brazing material is used to connect the second substrate $11b'_1$ and the second substrate $11'b_2$ and the first substrate 11'a. Therefore, the strength of the connection between the second substrate 11'b and the first substrate 11'a can be improved. This is also advantageous in that the fillets of a brazing material serve as stress-cushioning members to further improve the strength of the circuit substrate 11'.

Modification Examples of Circuit Substrate

FIG. 1b shows one modification example of the circuit substrate 11, that is, the circuit substrate.

The circuit substrate 11' includes at least two second substrates 11'b, namely, $11'b_1$ and $11'b_2$. A side surface of a first substrate 11'a is connected to a side surface of the second substrate $11'b_1$. The other side surface of the first substrate 11'a is connected to a side surface of the second substrate $11'b_2$. When each of the second substrates 11'b has through-hole conductors or metal pads 1i that function as electrodes 11'c, the circuit substrate 11' can have a multi-terminal structure, which is preferable. The circuit substrate 11' having a multi-terminal structure can be easily made by connecting the second substrate $11'b_1$ and the first substrate 11'a, and connecting the second substrate $11'b_2$ and the first substrate 11'a.

Basically, the same materials as those listed in the above-described embodiment may be used for the first substrate 11'a and the second substrate 11'b.

Figure 1C:
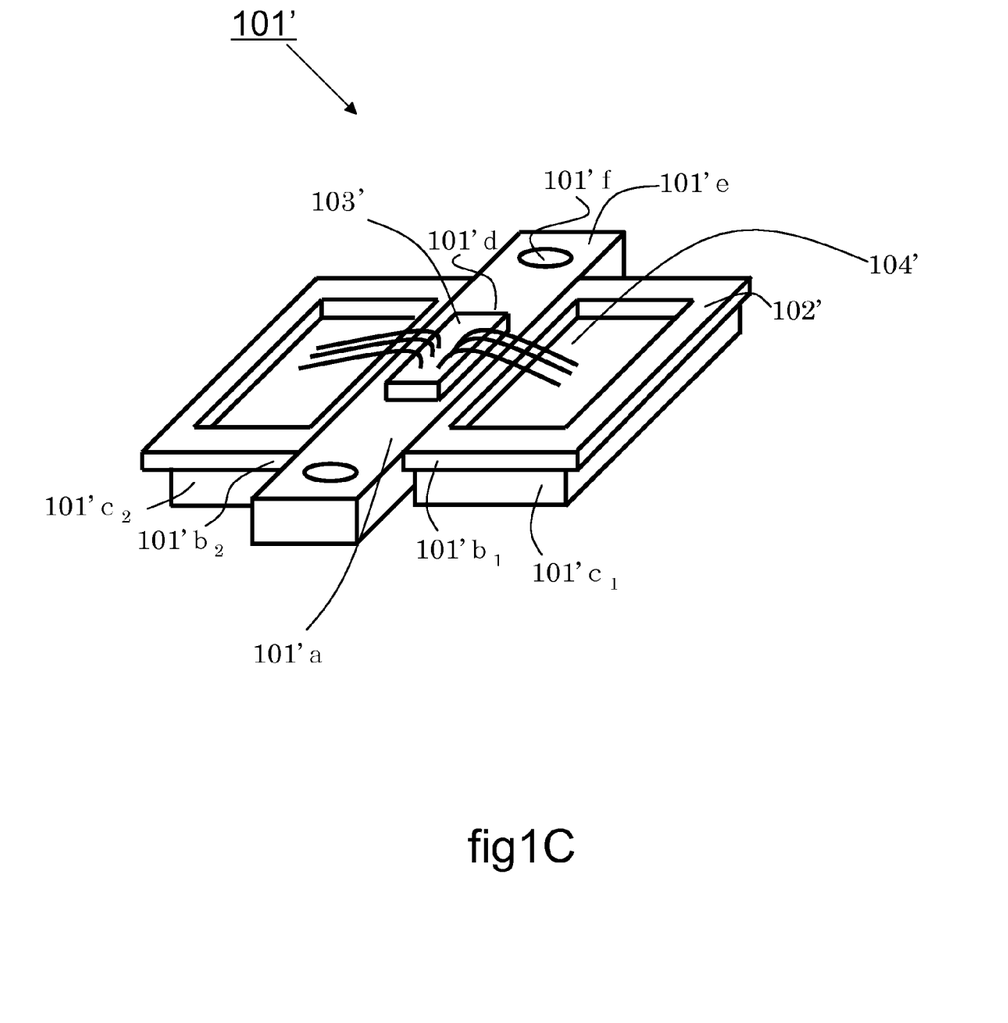
FIG. 1C is a perspective view of one modification example of the circuit substrate.

FIG. 1c shows one modification example of the circuit substrate 1, that is, circuit substrate 101'.

The circuit substrate 101' includes a first substrate 101'a, at least two frame-like second substrates 101'b having openings, and the electrodes 101'c covering the openings of the second substrates 101'b. The electrodes plate 101'c is connected to the second substrates 101'b so as to be disposed under the second substrate 101'b. The electrodes plate 101'c exposed through the openings are connected to the electronic component 103' through the bonding wirings 104'.

This increases the creepage distance between an electronics component 103' and each of the electrodes 101'c because of the existence of the step corresponding to the thickness of the second substrates 101'b. Thus, electrical insulation of the circuit substrate 101' can be improved.

Basically, the same materials as those listed in the above-described embodiment may be used for the first substrate 101'a and the second substrates 101'b.

Figure 1D:
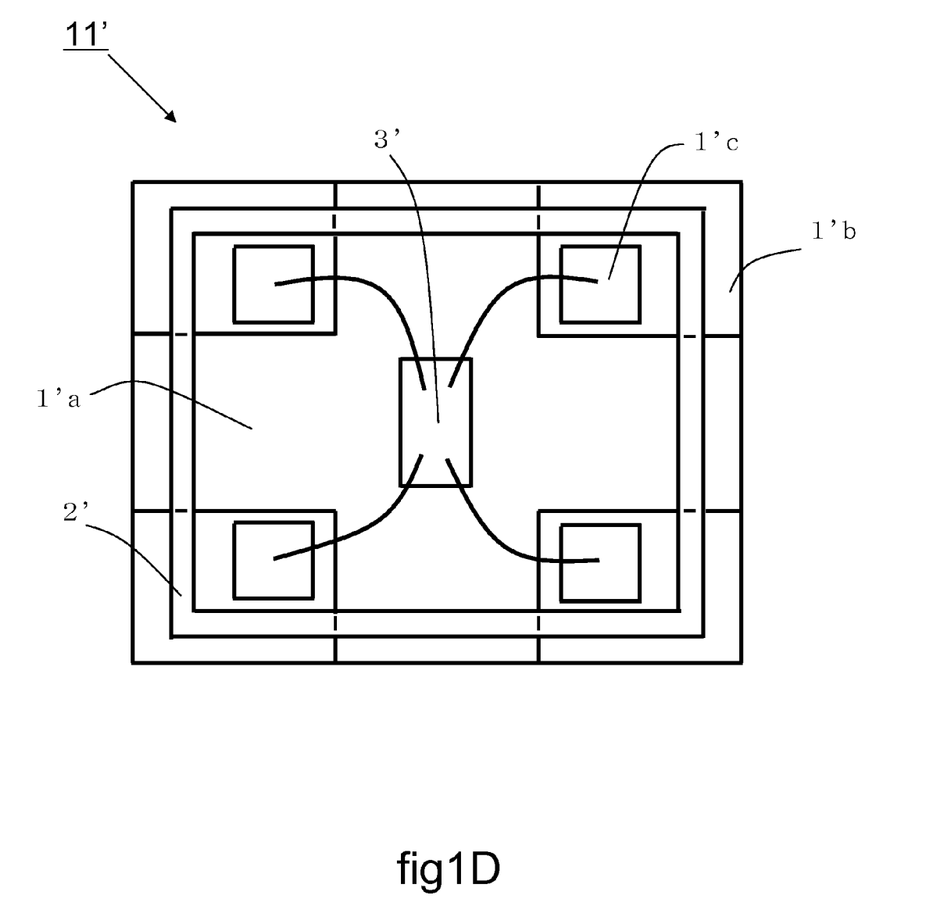
FIG. 1D is a plan view of one modification example of the circuit substrate.
Figure 1E:
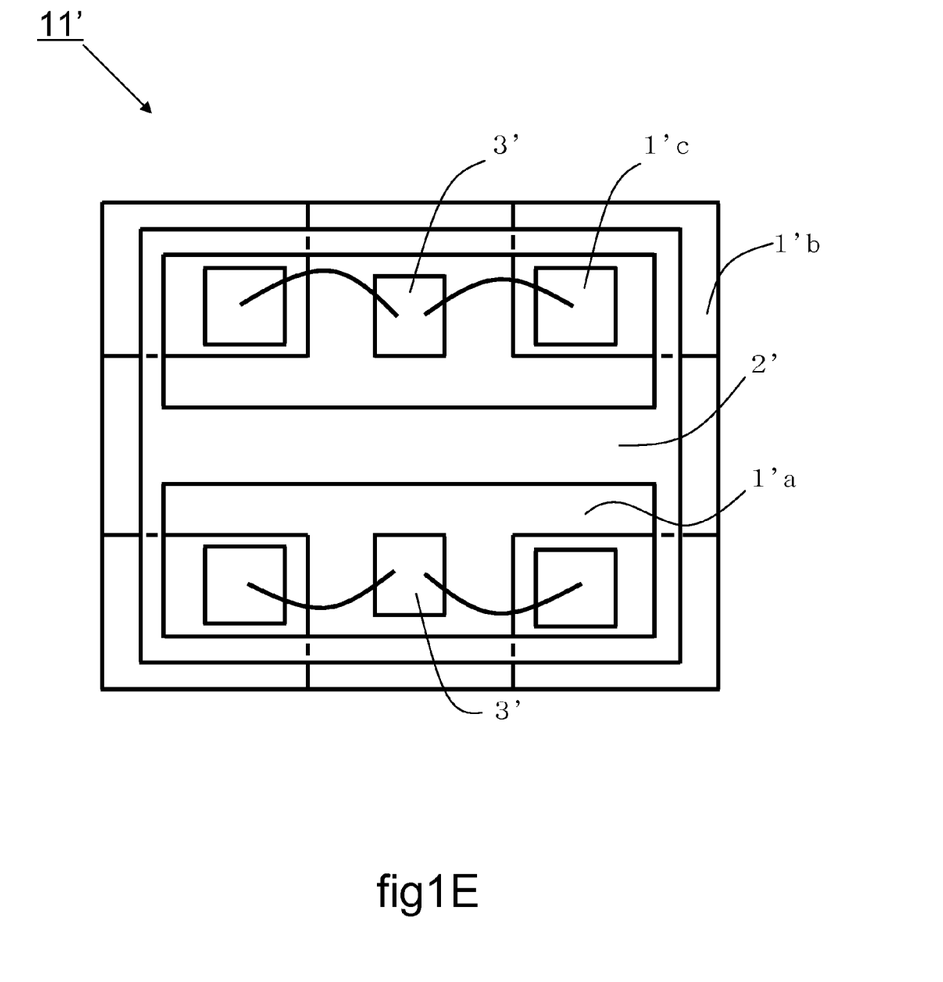
FIG. 1E is a plan view of one modification example of the circuit substrate.

FIG. 1d and FIG. 1e, respectively, show modification examples of the circuit substrate 1, that is, circuit substrates 1'.

Each of the first substrates 1' has a cross shape, where an electronics component 3' is to be mounted, and second substrates 1'b disposed at the four corners of the first substrate 1'a. The first substrate 1'a and the second substrates 1'b are arranged so as to together form a rectangular parallelepiped. That is, the circuit substrate 1' is different from the circuit substrate 1 at least in the shape of the first substrate 1'a and the number of the second substrates 1'b.

In these modification examples, since each of the second substrates 1'b has an electrode, the number of electrodes 1'c of the circuit substrate 1' can be increased. Thus, the circuit substrate 1' can easily have a multi-terminal structure. The circuit substrate 1' shown in FIG. 1d is different from that shown in FIG. 1e in the shape of a frame 2'.

Basically, the same materials as those listed in the above-described embodiment may be used for the first substrate 1'a and the second substrates 1'b.

Frame

The frame 2 according to the present embodiment is disposed on the circuit substrate 1, and encloses the region where the electronics component 3 is to be mounted. The above-described circuit substrate 1 and the frame 2 constitute the structure 10.

FIG. 2a shows the structure 10 according to one embodiment of the present invention. In FIG. 2a, the frame 2 is added to the circuit substrate 1 shown in FIG. 1a.

The frame 2 is disposed so as to cross the boundary between the first substrate 1a and the second substrate 1b. The frame 2 includes an insulating material, such as a ceramic, a glass, or a resin, to provide insulation from the circuit substrate 1 or an conductive material, such as metal materials or composite materials.

When the frame 2 includes the same material as one of the first substrate 1a and the second substrate 1b, it is preferable that the one of the first substrate 1a and the second substrate 1b have a larger contact area with the frame 2 than the other of the first substrate 1a and the second substrate 1b. This is because the difference of thermal expansion coefficients between frame 2 and the circuit substrate 1 can be reduced. This also can provide a strong connection between the frame 2 and the circuit substrate 1.

The frame 2 preferably has a larger width at the boundary between the first substrate 1a and the second substrate 1b than at the other region since the adhesion force of the frame to the circuit substrate 1 can be improved at the boundary where the thermal stress is easily accumulated.

If the frame 2 includes a material whose thermal expansion coefficient is less than that of the first substrate 1a or the second substrate 1b, the frame 2 can reduce the thermal expansion of the circuit substrate 1. This can reduce deformation of the structure and resulting displacement of the electronics component 3. This is effective particularly when the electronics component 3 includes an optical semiconductor element, because it stabilizes optical-axis alignment of the optical semiconductor element.

In addition, by setting a thermal expansion coefficient of the frame 2 closer to a thermal expansion coefficient of at lease one of the first substrate 1a and the second substrate 1b, residual stress in the structure 10 because of the thermal expansion of the structure 10 can be reduced. Thus, the reliability of the structure 10 is improved. To achieve this, the frame 2 and the second substrate 1b may include a ceramic, and the first substrate 1a may include a metal material such as a copper-tungsten composite, a copper-molybdenum composite, an iron (Fe)—nickel (Ni)-cobalt (Co) alloy, and an iron (Fe)-nickel (Ni) alloy, for example.

When the frame 2 and the second substrate 1b include a ceramic, they may be formed together using a known ceramic-green-sheet laminating method or the like. First, a first ceramic green sheet that will become the second substrate 1b, and a dummy substrate adjoining thereto side by side are prepared. Then, a second ceramic green sheet to become the frame 2 is placed on the top surface of the first ceramic green sheet and the dummy substrate, which is applied with a release agent, so as to cross the boundary therebetween. Finally, they are subject to firing. Thus, the first ceramic green sheet and the second ceramic green sheet can be formed together. The dummy substrate and the frame 2 can easily be separated because of the existence of the release agent. The first substrate 1a is then connected together with the second substrate 1b and the frame 2 using a brazing material or the like, thereby providing the structure 10 according to one embodiment.

In this case, the circuit substrate 1 and the frame 2 are separated only in the region between the first substrate 1a and the frame 2. Accordingly, degradation in sealing property of the structure 10 can be reduced.

FIG. 3A shows one modification example of the structure 11'. In FIG. 3a, a frame 12' is added to the circuit substrate 11' shown in FIG. 1b.

Figure 4A:
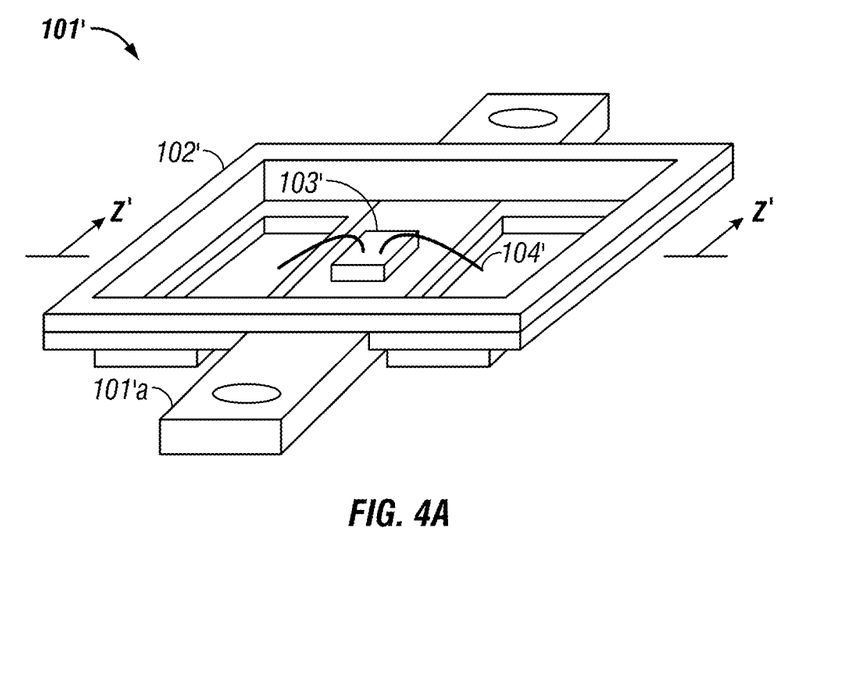
FIG. 4A is a perspective view of one modification example of the structure.

FIG. 4a shows one modification example of the structure 101'. In FIG. 4a, a frame 102' is added to the circuit substrate 101' shown in FIG. 1c.

Electronic Component

It is preferable that the electronic component 3 include a silicon carbide (SiC) semiconductor. Silicon carbide (SiC) semiconductors generate less heat than known silicon (Si) semiconductors. Therefore, even when a larger electric current is applied to the electronics component 3, generation of heat is suppressed, whereby further stable operation of the electronics component 3 can be realized.

When the electronics component 3 is mounted on the mounting portion 1d of the first substrate 1a, for example, an adhesive, such as a glass, a resin, or a brazing material may be used. An adhesive containing copper particles, which are good thermal conductors, may further improve the heat dissipation.

Sealing Structure of Electronics Component

Figure 5A:
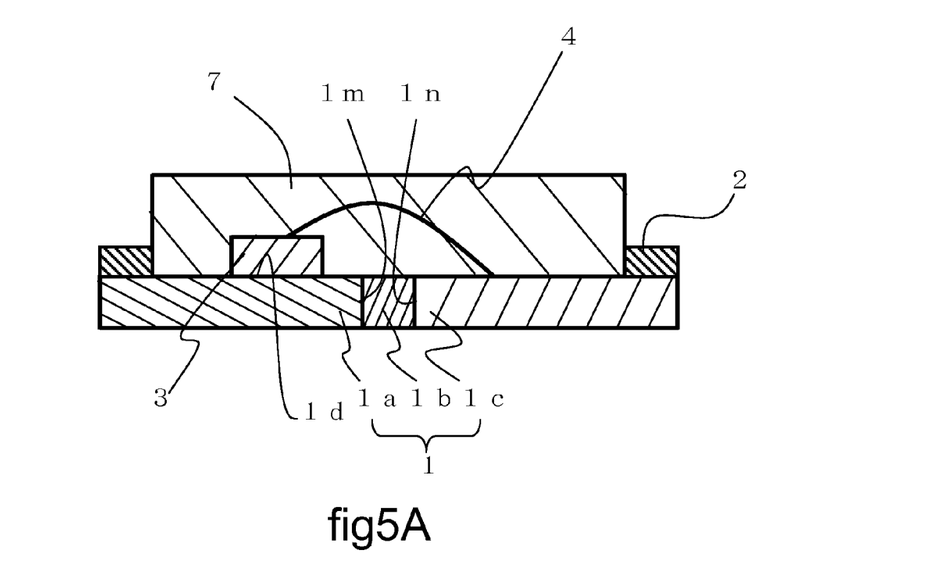
FIG. 5A is a sectional view of the electronics device shown in FIG. 1A.

As shown in FIG. 5a, it is preferable that the electronics component 3 be covered by a sealing material, such as the resin 7. Examples of the resin 7 used as a sealing material include epoxy resin, polyphenylene sulfide resin, liquid crystal polymer resin, and silicone resin. It is preferable that the resin 7 be deposited so as to cover the circuit substrate 1 and the electronics component 3 disposed thereon, whose electrode is electrically connected to the electrode 1c, as shown in FIG. 5a.

This configuration does not require a lid to be disposed on the frame 2 for sealing the electronics component 3, and makes the interior space of the electronics device compact. However, a lid may of course be provided on the frame 2 in addition to the resin 7, to further increase the degree of sealing of the electronics component 3.

Figure 5B:
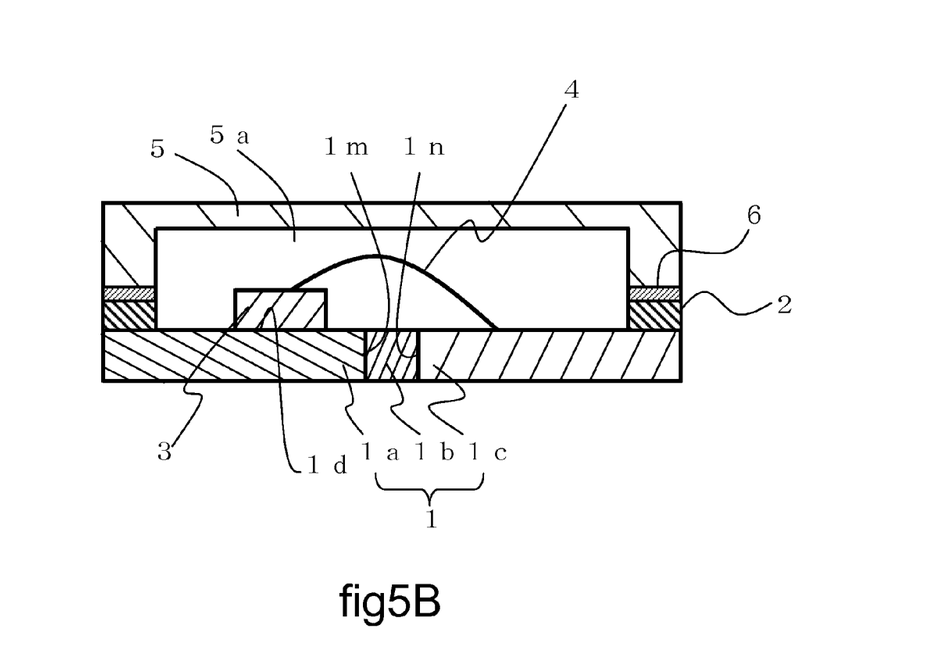
FIG. 5B is a sectional view of one modification example of a sealing structure of the electronics component.

In one modification example of sealing structure of the electronics component 3, a lid 5 may be used instead of the resin 7, as shown in FIG. 5b.

The lid 5 is disposed on the frame 2 to form an enclosed space between the lid 5, the frame 2, and the circuit substrate 1, thereby sealing the electronics component 3.

Figure 3B:
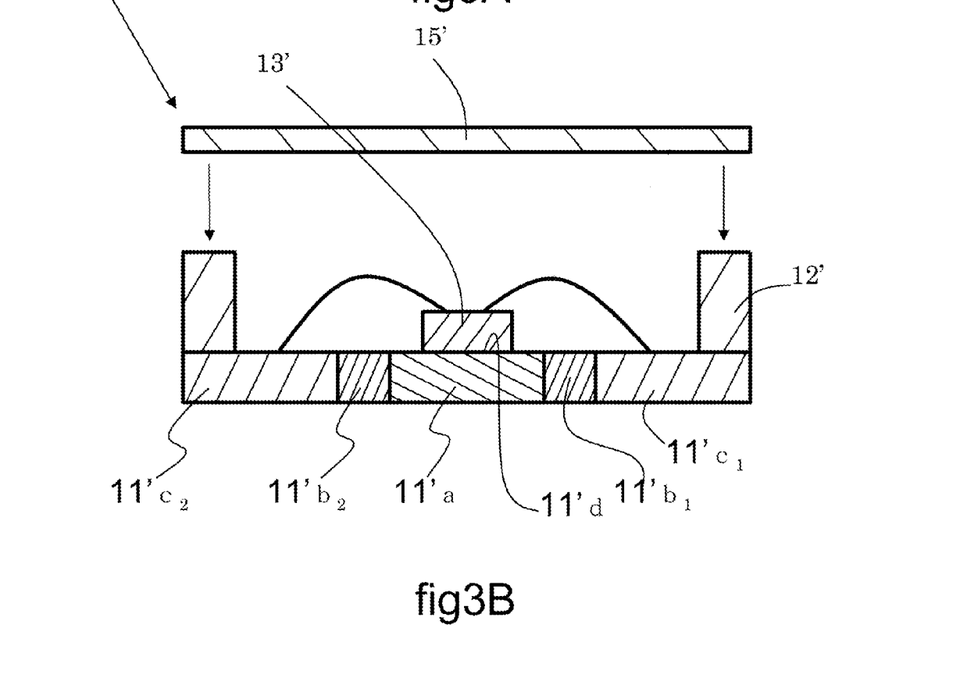
FIG. 3B is a sectional view of the structure shown in FIG. 3A, taken along line Y-Y'.
Figure 4B:
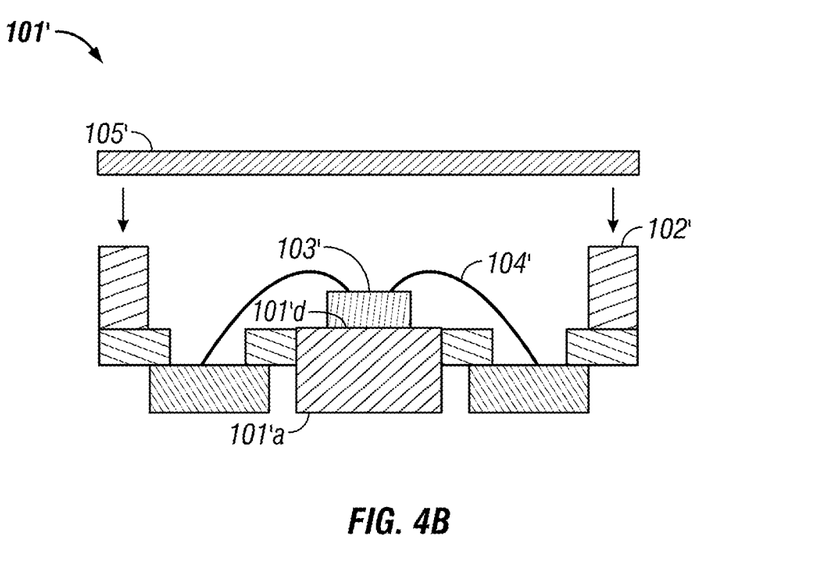
FIG. 4B is a sectional view of the structure shown in FIG. 4A, taken along line Z-Z'.

The lid 5 may be in the shape of either a container having a space 5a, as shown in FIG. 5b, or a plate, as shown in FIGS. 2b, 3b, and 4b.

Although the lid 5 may include an insulating material and/or a conductive material, the material should preferably have a good sealing property. Examples of insulating materials include ceramics, such as sintered alumina (Al2O3), sintered aluminum nitride (AlN), sintered mullite (3Al2O3.2SiO2), and glass-ceramics, and resins.

The conductive material for lid 5 includes a metal material such as an iron (Fe)-nickel (Ni)-cobalt (Co) alloy, an iron (Fe)-nickel (Ni) alloy, or stainless steel (SUS). The lid 5 including one of the aforementioned materials can block the external electronic magnetic noise. In the structure shown in FIG. 5b, an adhesive 6 for connecting the frame 2 and the lid 5 may be an insulating material or a conductive material such as solder.

The frame 2 and the lid 5 are connected to each other using the adhesive 6. Examples of the adhesive 6 include an adhesive including a main component as a resin such as epoxy resin, an insulating adhesive including a main component as a glass such as lead (Pb) glass or solder glass. The material of the adhesive may be chosen according to the materials of the lid 5 and the frame 2.

While various embodiments of the present invention have been described above, it should be understood that they have been presented by way of example only, and not of limitation.

For example, in the above-described embodiments, the package is not limited to a rectangular shape in a plan view, and it may be of any shape. In FIGS. 3a and 4a, it is preferable that the circuit substrate have a circular arc portion at the outer periphery thereof. This circular arc portion can ease stress applied to the circuit substrate 1. Connection surfaces between the first substrate 1a and the second substrate 1b, and between the second substrate 1b and the electrode 1c are not necessarily flat. The side surfaces of the first substrate 1a and the second substrate 1b may be provided with a recess and a projection so as to be fitted together. This increases the connection strength between the first substrate 1a and the second substrate 1b.

The above figures may depict exemplary configurations for the invention, which is done to aid in understanding the features and functionality that can be included in the invention. The invention is not restricted to the illustrated architectures or configurations, but can be implemented using a variety of alternative architectures and configurations. Additionally, although the invention is described above in terms of various exemplary embodiments and implementations, it should be understood that the various features and functionality described in one or more of the individual embodiments with which they are described, but instead can be applied, alone or in some combination, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof, and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A structure comprising:
a circuit substrate comprising a first substrate including a region where an electronics component is to be mounted and second substrates, the first substrate comprising a first side surface and each of the second substrates comprising a second side surface connected to the first side surface; and
a frame disposed on the circuit substrate so that the region is inside the frame and crosses over a boundary between the first side surface and the second side surface in a plane view;
wherein the first substrate has a cross shape in a plane view, and the second substrates are disposed at four corners of the first substrate;
the first substrate consists of a metal and the second substrate consists of an insulating material; and
the bottom surface of the first substrate and the bottom surface of the second substrate are in the substantially a same level.

2. A structure according to claim 1,
wherein the first substrate have a projection portion which is outside the frame in the plane view.
3. A structure according to claim 2, wherein the projection portion of the first substrate is more outward to the frame than that of the second substrate.
4. A structure according to claim 3, wherein the first substrate has a penetrating hole outside the frame.
5. A structure according to claim 1,
wherein the frame and the second substrate are formed together.
6. A structure according to claim 1,
wherein the circuit substrate includes at least two of the second substrates;
wherein the first substrate comprises the first side surface and a third side surface opposed to the first side surface;
wherein one of the second substrates comprises the second side surface connected to the first side surface, and
wherein another second substrate comprises a fourth side surface connected to the third side surface.
7. A structure according to claim 1, wherein the second substrate includes a through-hole conductor.
8. A structure according to claim 1, further comprising an electrode on the second substrate.
9. A structure according to claim 1, wherein the top surface of the first substrate is higher than that of the second substrate.
10. The electronics device according to claim 1, wherein the frame is disposed on the first and second substrates.
11. An electronics device comprising:
a structure comprising a circuit substrate comprising a first substrate including a region where an electronics component is to be mounted and second substrates, the first substrate comprising a first side surface and each of the second substrates comprising a second side surface connected to the first side surface, and a frame disposed on the circuit substrate so that the region is inside the frame and crosses over a boundary between the first side surface and second side surface in a plane view; and
the electronics component mounted on the region of the first substrate,
wherein the first substrate has a cross shape in a plane view, and the second substrates are disposed at four corners of the first substrate;
the first substrate consists of a metal and the second substrate consists of an insulating material; and
the bottom surface of the first substrate and the bottom surface of the second substrate are in the substantially a same level.
12. An electronics device according to claim 11,
wherein the electronics component has the current flowing therein of not less than 30 A.
13. An electronics device according to claim 11,
wherein the electronics component includes a semiconductor comprising a silicon-carbide.
14. An electronics device according to claim 11,
wherein the electronics component is an inverter.
15. An electronics device according to claim 11, further comprising:
a resin on the electronics component, sealing the electronics component.
16. The electronics device according to claim 11, further comprising:
a lid on the frame, covering the frame to form an enclosed space between the circuit substrate, the frame, and the lid.

* * * * *